United States Patent
Yeh et al.

(10) Patent No.: US 11,010,136 B2
(45) Date of Patent: May 18, 2021

(54) RANDOM BIT STREAM GENERATOR AND METHOD THEREOF

(71) Applicant: Novatek Microelectronics Corp., Hsinchu (TW)

(72) Inventors: Che-Wei Yeh, Hsinchu (TW); Keko-Chun Liang, Hsinchu (TW); Yu-Hsiang Wang, Hsinchu (TW)

(73) Assignee: Novatek Microelectronics Corp., Hsinchu (TW)

( * ) Notice: Subject to any disclaimer, the term of this patent is extended or adjusted under 35 U.S.C. 154(b) by 239 days.

(21) Appl. No.: 16/159,734

(22) Filed: Oct. 15, 2018

(65) Prior Publication Data

US 2019/0243612 A1    Aug. 8, 2019

Related U.S. Application Data

(60) Provisional application No. 62/628,263, filed on Feb. 8, 2018.

(51) Int. Cl.
*G06F 7/58* (2006.01)
*H03M 3/00* (2006.01)
*H03K 3/84* (2006.01)

(52) U.S. Cl.
CPC .............. *G06F 7/584* (2013.01); *G06F 7/588* (2013.01); *H03K 3/84* (2013.01); *H03M 3/414* (2013.01)

(58) Field of Classification Search
CPC ........... G06F 7/584; G06F 7/588; H03K 3/84; H03M 3/414
See application file for complete search history.

(56) References Cited

U.S. PATENT DOCUMENTS 6,151,613 A * 11/2000 Khoini-Poorfard ............ H03H 17/0614
708/313
9,106,211 B2   8/2015 Wiesbauer et al.
(Continued)

FOREIGN PATENT DOCUMENTS

CN   104052487   9/2014
CN   105556848   5/2016

OTHER PUBLICATIONS

Zhipeng Ye, Student Member, IEEE, and Michael Peter Kennedy, Fellow, IEEE; "Reduced Complexity MASH Delta-Sigma Modulator," IEEE Transactions on Circuits and Systems—II: Express Briefs, vol. 54, No. 8 (Year: 2007).*

(Continued)

*Primary Examiner* — Michael D. Yaary
(74) *Attorney, Agent, or Firm* — JCIPRNET

(57) ABSTRACT

A random bit stream generator which includes a pseudo-random bit stream generator and a multi-stage noise shaping (MASH) delta-sigma modulator is introduced. The pseudo-random bit stream generator may generate a first random bit stream according to a first clock signal. The MASH delta-sigma modulator is coupled to the first random bit stream generator to receive the first random bit stream and output a second random bit stream according to the first random bit stream and a second clock signal. A frequency of the second clock signal is greater than a frequency of the first clock signal, and the random bit stream has bell-shaped distribution. A method of generating a random bit stream having bell-shaped distribution adapted to a random bit stream generator is also introduced.

11 Claims, 6 Drawing Sheets

(56) References Cited

U.S. PATENT DOCUMENTS

| | | | |
|---|---|---|---|
| 9,225,349 B2* | 12/2015 | Bourdi | H03M 3/422 |
| 9,231,606 B2 | 1/2016 | Bourdi et al. | |
| 9,450,593 B2 | 9/2016 | Bourdi et al. | |
| 9,654,122 B2 | 5/2017 | Bourdi et al. | |
| 2002/0121994 A1* | 9/2002 | Bolton, Jr. | H03M 7/3008 341/143 |
| 2014/0270261 A1 | 9/2014 | Wiesbauer et al. | |
| 2015/0055737 A1 | 2/2015 | Bourdi et al. | |
| 2015/0055738 A1 | 2/2015 | Bourdi et al. | |
| 2016/0087642 A1 | 3/2016 | Bourdi et al. | |
| 2016/0373123 A1 | 12/2016 | Bourdi et al. | |

OTHER PUBLICATIONS

Tang, "The Research on Sigma-delta Modulator and Its Applications in Mixed-signal System." Doctor's thesis, Jun. 2008, Electrical engineering Graduate School, Hunan University, pp. 1-119.

* cited by examiner

RANDOM BIT STREAM GENERATOR AND METHOD THEREOF

CROSS-REFERENCE TO RELATED APPLICATION

This application claims the priority benefit of U.S. provisional application Ser. No. 62/628,263, filed on Feb. 8, 2018. The entirety of the above-mentioned patent application is hereby incorporated by reference herein and made a part of this specification.

BACKGROUND

Technical Field

The disclosure generally relates to a random bit stream generator and a method thereof, and more particularly to a random bit stream generator and a method thereof that are capable of generating a random bit stream with bell-shaped distribution.

Description of Related Art

Random bit stream generators are essential components in many electronic devices, especially in a field of display panel and displaying technology. The existing random bit stream generators may generate random bit streams with uniform distribution. However, along with the development of the technology and the market demands, random bit streams with uniform distribution do not completely satisfy the designed needs and expectation.

Therefore, it would be desirable to have a random bit stream generator that is capable of generating a random bit stream with bell-shaped distribution. Furthermore, it is more preferable to reduce the chip area of the random bit stream generator.

Nothing herein should be construed as an admission of knowledge in the prior art of any portion of the present disclosure.

SUMMARY

A random bit stream generator and a method thereof that are capable of generating a random bit stream with bell-shaped distribution are introduced herein.

The random bit stream generator includes a pseudo-random bit stream generator and a multi-stage noise shaping (MASH) delta-sigma modulator. The pseudo-random bit stream generator is configured to generate a first random bit stream according to a first clock signal. The MASH delta-sigma modulator is coupled to the pseudo-random bit stream generator, and is configured to receive the first random bit stream and output a second random bit stream according to the first random bit stream and a second clock signal. A frequency of the second clock signal is greater than a frequency of the first clock signal, and the second random bit stream has bell-shaped distribution.

The present disclosure further introduces a method of generating a random bit stream adapted to a random bit stream generator. The method includes steps of generating a first random bit stream according to a first clock signal and generating the random bit stream according to the first random bit stream and a second clock signal. A frequency of the second clock signal is greater than a frequency of the first clock signal, and the second random bit stream has bell-shaped distribution.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

It is to be understood that other embodiments may be utilized and structural changes may be made without departing from the scope of the present disclosure. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted," and variations thereof herein are used broadly and encompass direct and indirect connections, couplings, and mountings.

Figure 1:
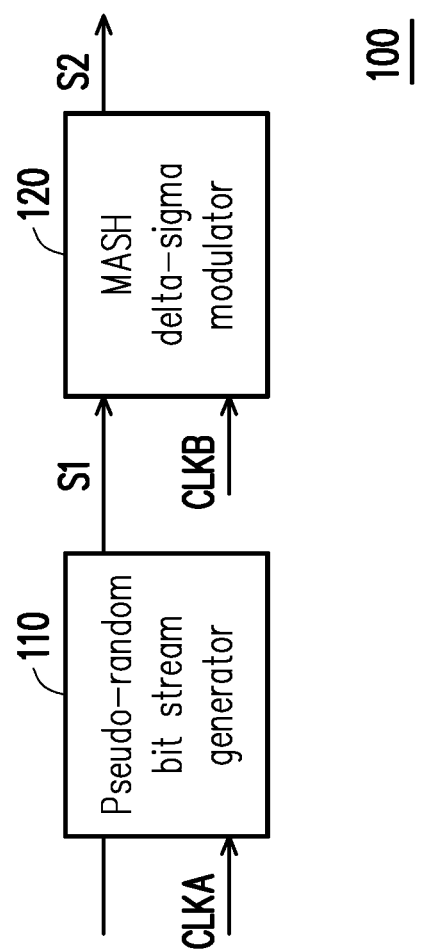
FIG. 1 illustrates a schematic diagram of a random bit stream generator according to an embodiment of the present disclosure.

Referring to FIG. 1, a random bit stream generator 100 includes a pseudo-random bit stream generator 110 and a MASH delta-sigma modulator 120. The pseudo-random bit stream generator 110 receives a clock signal CLKA and outputs a first random bit stream S1 according to the clock signal CLKA. In an embodiment of the present application, the pseudo-random bit stream generator 110 may be a Pseudo-random binary sequence (PRBS) generator which generates a PRBS according to the clock signal CLKA, but the disclosure is not limited thereto. The pseudo-random bit stream generator 110 may generate an L bit random bit stream S1, where L is an integer.

The MASH delta-sigma modulator 120 is coupled to the pseudo-random bit stream generator 110 to receive a clock signal CLKB and the random bit stream S1 from the pseudo-random bit stream generator 110. The MASH delta-sigma modulator 120 generates a random bit stream S2 according to the received clock signal CLKB and the received random bit stream S1. The random bit stream S2 may be an N-bits random bit stream, where N is an integer which may be the same or different from L. A frequency of the clock signal CLKB may be different from a frequency of the clock signal CLKA. In an embodiment of the disclosure, the frequency of the clock signal CLKB is greater than the frequency of the clock signal CLKA.

In an embodiment of the disclosure, the MASH delta-sigma modulator 120 includes a plurality of cascaded stages, wherein each of the cascaded stages is a first-order delta-sigma stage. A number of the cascaded stages of the MASH delta-sigma modulator 120 is not limited in this disclosure. It should be noted that a definition of first-order delta-sigma stage is well known in the related field, thus the detailed description is omitted herein.

Figure 2:
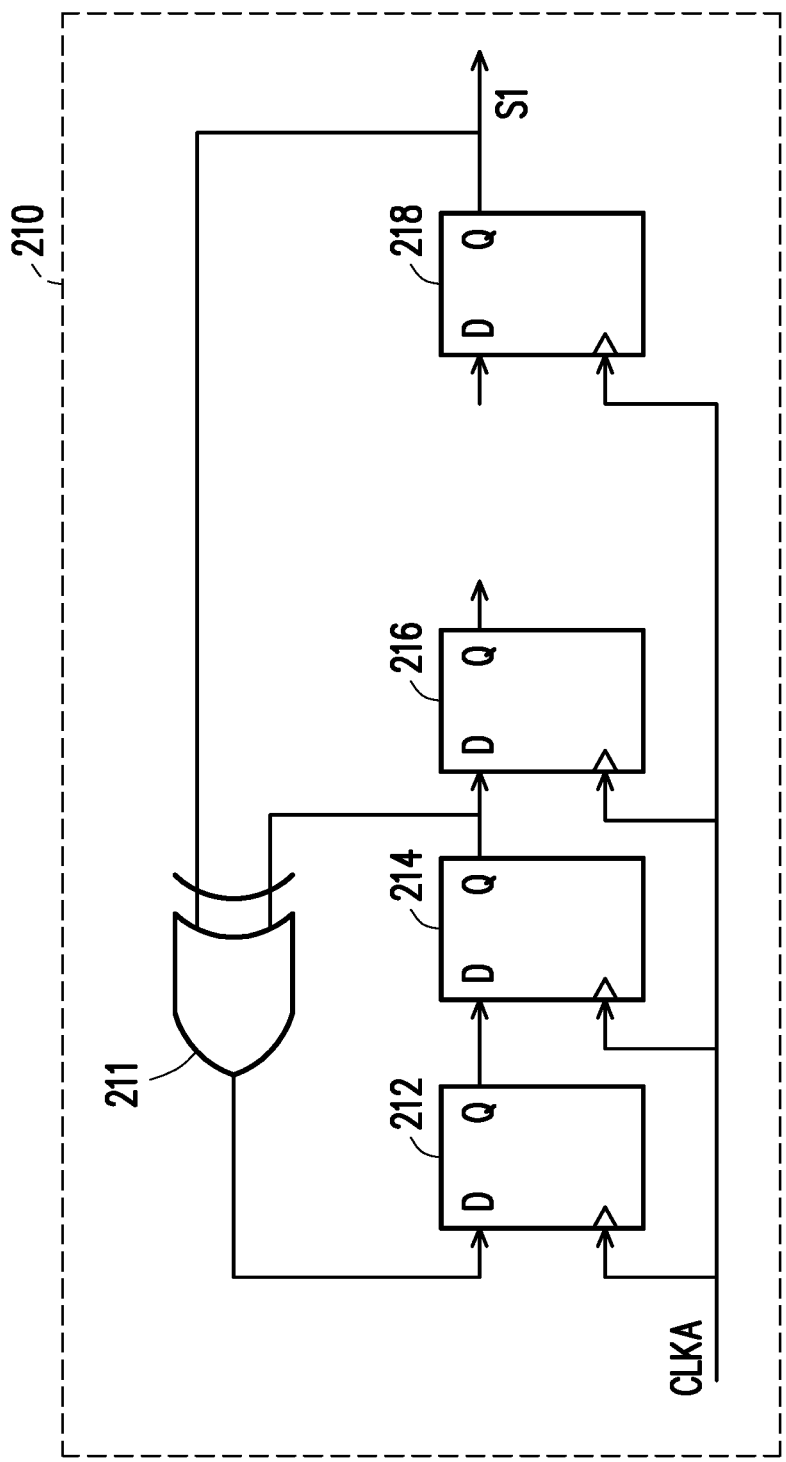
FIG. 2 illustrates a schematic diagram of a pseudo-random bit stream generator of a random bit stream generator according to an embodiment of the present disclosure.

Referring to FIG. 2, a detailed structure of a pseudo-random bit stream generator 210 is illustrated. The pseudo-random bit stream generator 210 includes D-flip-flips (DFFs) 212 to 218 coupled in cascade. The data terminal of the DFF 214 receives the output of the previous DFF 212 and provide an output to the next DFF 216 in the cascaded DFFs 212 to 218. The output of the pseudo-random bit stream generator 210 is provided at the output terminal of the DFF 218 (also referred to as a last DFF) and is served as the random bit stream S1.

The pseudo-random bit stream generator 210 further includes a logical circuit 211. The inputs of the logical circuit 211 receive the outputs of two of the DFFs 212 to 218, and the logical circuit 211 performs a logical operation on the received input values and then provides an output to the DFF 212 (also be referred to as a first DFF). In FIG. 2, the outputs of the DFFs 214 and 218 are provided to the logical circuit 211, but the disclosure is not limited thereto. The pseudo-random bit stream generator 210 may generate a random bit stream S1 according to a predetermined polynomial, and which DFFs providing outputs to the logical circuit 211 is determined according to the predetermined polynomial.

In an embodiment of the present application, the logical circuit 211 includes an XOR gate, and the logical circuit 211 may perform and XOR operation on the received input values. In an embodiment of the disclosure, the pseudo-random bit stream generator 210 generates the random bit stream S1 using linear feedback shift registers (LFSRs). Since generating a random bit stream using LFSRs is well known in the related art, the detailed description is omitted herein.

Figure 3:
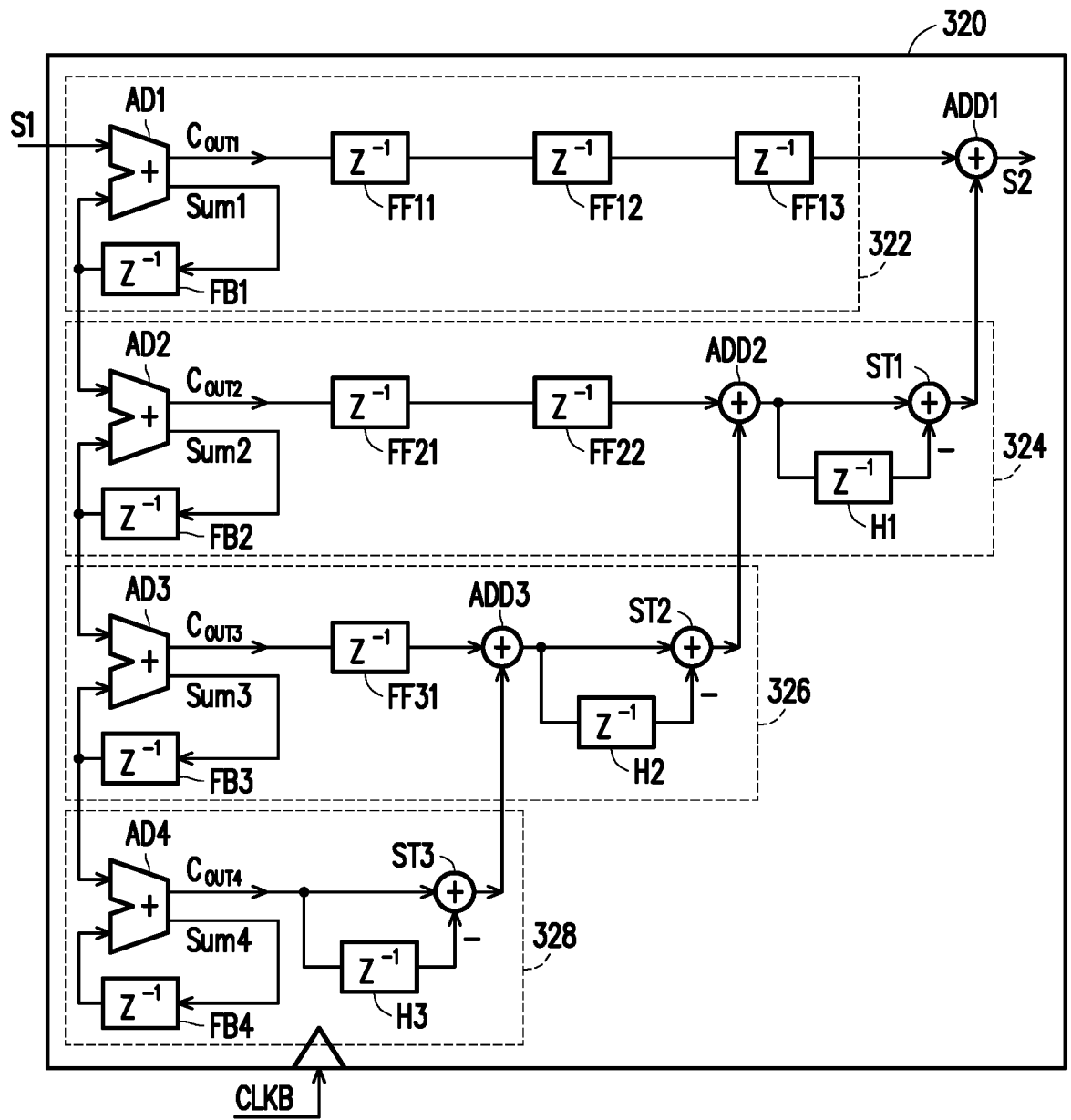
FIG. 3 illustrates a schematic diagram of a MASH delta-sigma modulator of a random bit stream generator according to an embodiment of the present disclosure.

Referring to FIG. 3, a MASH delta-sigma modulator 320 of a random bit stream generator includes a plurality of stages 322 to 328 connected in cascade.

The stage 328 is coupled to the stage 326 (e.g., previous stage) to receive a feedback bit stream of the stage 326. The stage 328 includes an adder AD4, a feedback circuit FB4, a holding circuit H3 and a subtractor ST3. The adder AD4 is configured to add the feedback bit stream of the stage 326 and the feedback stream of the stage 328 to generate a summed bit stream Sum4 and an overflow bit stream Cout4. The feedback circuit FB4 may feedback the summed bit stream Sum4 being delayed for one clock cycle of the clock signal CLKB to an input of the adder AD4. The holding circuit H3 is configured to hold the overflow bit stream of the stage 328 being delayed for one clock cycle of the clock signal CLKB; and the subtractor may subtracts the output of the holding circuit H3 from the overflow bit stream Cout4. The output of the subtractor ST3 is provided to the stage 326.

The stage 326 includes an adder AD3, a feedback circuit FB3, a delay element FF31, an adder ADD3, a holding circuit H2 and a subtractor ST2. The adder AD3 may add a feedback bit stream of the previous stage (stage 324) and a feedback of the stage 326 to generate a summed bit stream Sum3 and an overflow bit stream Cout3. The feedback circuit FB3 feeds the summed bit stream Sum3 being delayed for one clock cycle of the clock signal CLKB back to the stage 328. The delay element FF31 delays the overflow bit stream Cout3, and provides the delayed Cout3 to the adder ADD3. The adder ADD3 may add the delay Cout3 and the output of the subtractor ST3; and the subtractor ST2 subtracts the output of holding circuit H2 (which holds the outputs of ADD3 being delayed for one clock cycle) and the output of the ADD3, and provides the subtracted value to the stage 324.

The stage 324 includes an adder AD2, a feedback circuit FB2, delay elements FF21 and FF22, a holding circuit H1 and a subtractor ST1. The adder AD2 may add a feedback bit stream of the stage 322 and a feedback bitstream of the stage 324 to generate a summed bit stream Sum2 and an overflow bit stream Cout2. The feedback circuit FB2 may feed the summed bit stream Sum2 being delayed for one clock cycle of the clock signal CLKB to next stage (stage 326). The delay elements FF21 and FF22 may delay the overflow bit stream Cout2 for two clock cycles of the clock signal CLKB; and the adder ADD2 adds the delayed overflow bit stream and the output of the subtractor ST2. The subtractor ST1 subtracts the output of the holding circuit H1 (which holds output of the adder ADD2 being delay for one clock cycle) from the output of the adder ADD2, and provides a subtracted value to the stage 322.

The stage 322 is coupled to pseudo-random bit stream generator to receive a random bit stream S1. The stage 322 includes an adder AD1, a feedback circuit FB1, and a plurality of delay elements such as FF11, FF12 and FF13. The adder AD1 is configured to add the received random bit stream S1 with a feedback bit stream of the stage 322 to output a summed bit stream Sum1 an overflow bit stream Cout1. The feedback circuit FB1 may feedback the summed bit stream Sum1 being delayed for one clock cycle of the clock signal CLKB to the stage 324. The delay elements FF11, FF12 and FF13 delay the overflow bit stream Cout1 for three clock cycles of the clock signal CLKB. The adder ADD1 may add the delayed Cout1 and the output of the subtractor ST1 to output the random bit stream S2 which has bell-shaped distribution.

In the embodiment shown in FIG. 3, the MASH delta-sigma modulator 320 has four stages 322, 324, 326 and 328, but the number of the stages is not limited in this disclosure. In addition, each stages of the MASH delta-sigma modulator 320 shown in FIG. 3 is a first-order delta-sigma stage, but the MASH delta-sigma modulator with higher order stage falls within the scope of the disclosure.

Figure 4A:
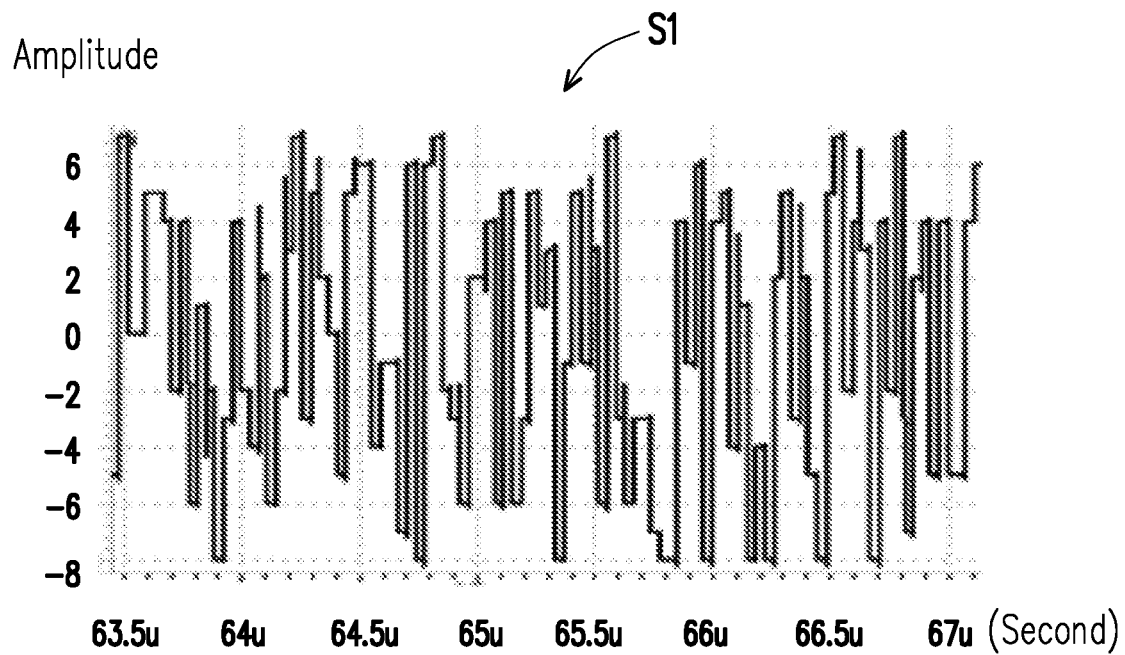
FIG. 4A to FIG. 4D illustrate exemplary random bit streams and distribution of the random bit streams generated by a random bit stream generator according to an embodiment of the present disclosure.
Figure 4B:
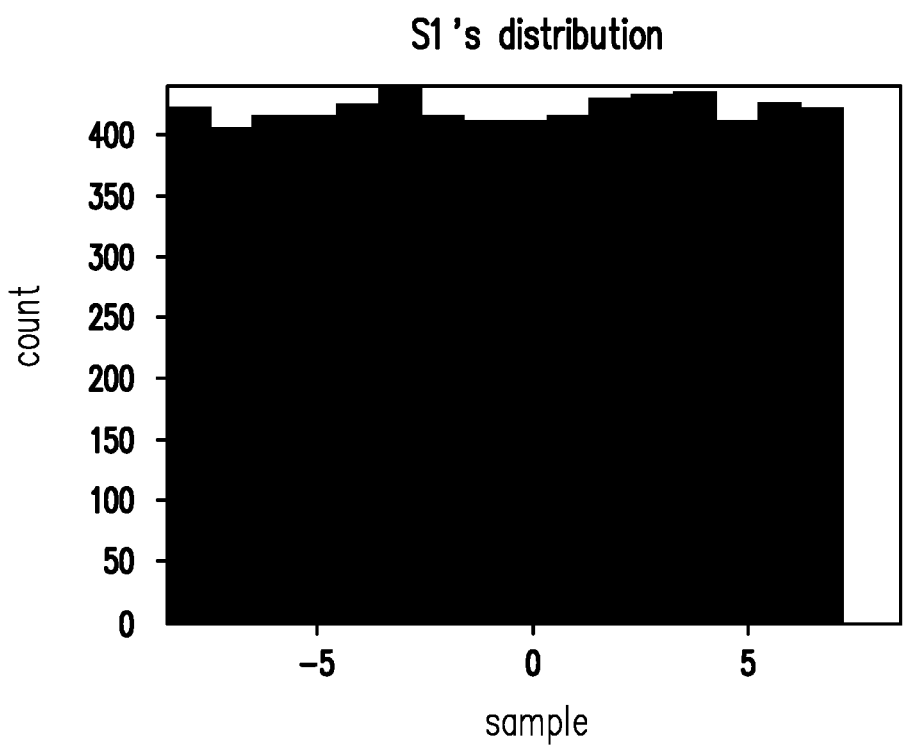
Figure 4C:
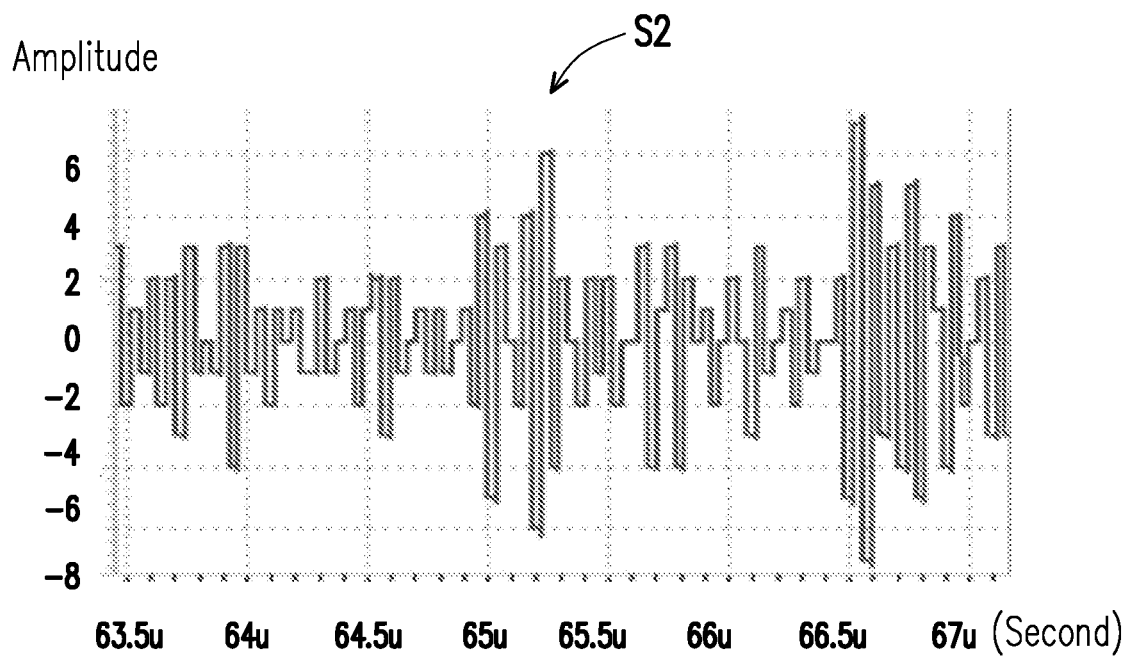
Figure 4D:
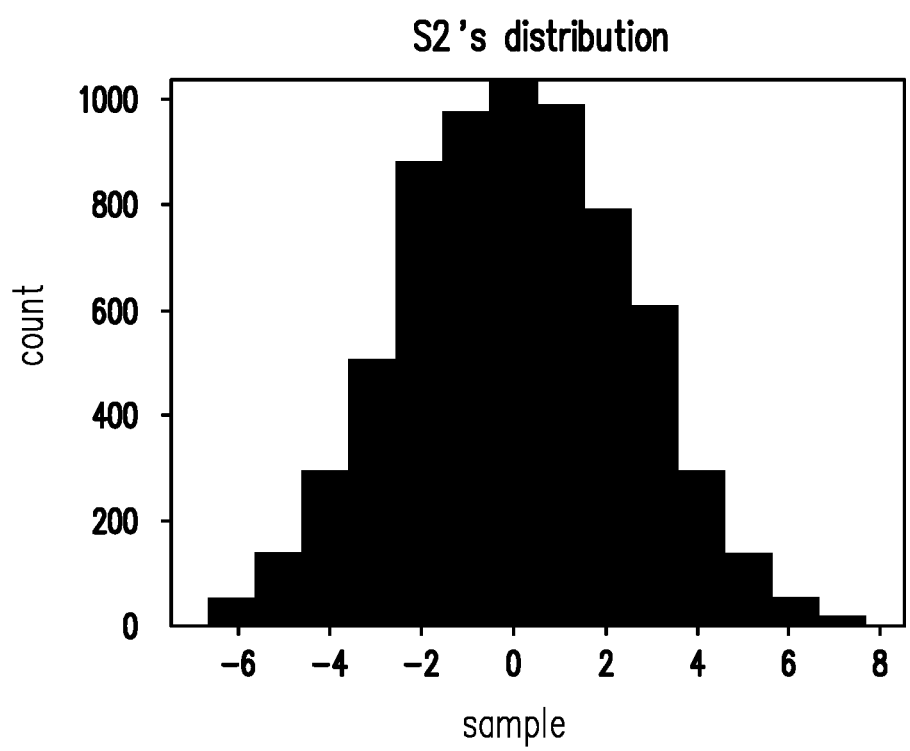

FIG. 4A to FIG. 4C illustrate exemplary random bit streams and their distribution generated by a random bit stream generator according to an embodiment of the present disclosure. In FIG. 4A and FIG. 4B, the random bit stream (e.g., random bit stream S1 outputted by the pseudo-random bit stream generator 110 in FIG. 1) has random distribution. In FIG. 4C and FIG. 4D, the random bit stream (e.g., random bit stream S2 outputted by the MASH delta-sigma modulator 120 in FIG. 1) has bell-shaped distribution.

Figure 5:
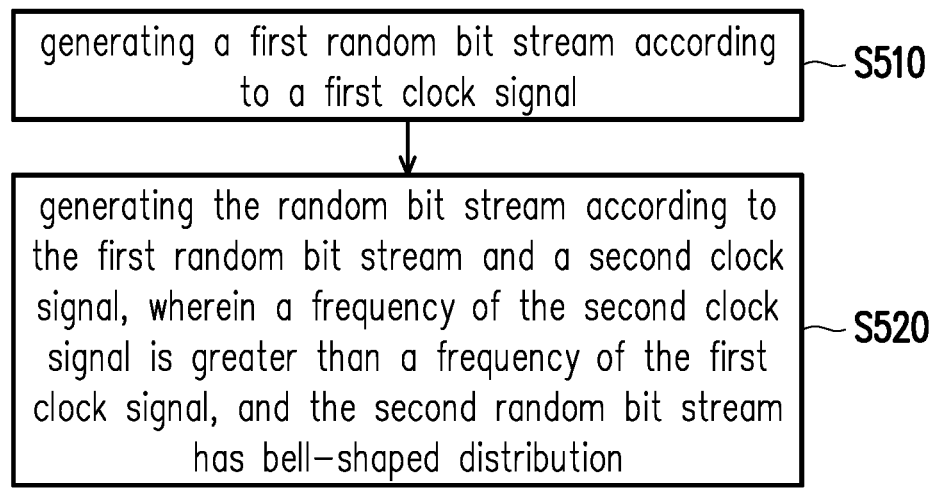
FIG. 5 illustrates steps of a method of generating a random bit stream according to an embodiment of the present disclosure.

FIG. 5 illustrates a method of generating a random bit stream according to an embodiment of the present disclosure. In step S510, a first random bit stream is generated according to a first clock signal. In steps S520, a random bit stream is generated according to the first random bit stream and a second clock signal, where a frequency of the second clock signal is greater than a frequency of the first clock signal, and the second random bit stream has bell-shaped distribution.

The generated random bit stream with the bell-shaped distribution may be used in an analog-to-digital converter (ADC) or a digital-to-analog converter (DAC) to improve the dynamic range of the ADC or the DAC. For example, the random bit stream generated that an exemplary random bit stream generator in this disclosure may be used to dither signals in the ADC or DAC so that the dynamic range of the ADC or DAC is improved for a dithering range. In addition, by combining the L-bits pseudo-random bit stream generator and the N-bits MASH delta-sigma modulator to generate the random bit stream, the generated random bit stream may have dithering range equivalent to the noise generated by M-bits MASH delta-sigma modulator, where M is greater than N. In other words, smaller chip area is needed for the random bit stream generator, and less power consumption is consumed.

From the above embodiments, a random bit stream generator includes a pseudo-random bit stream generator for generating a first random bit stream according to a first clock signal and a MASH delta-sigma modulator for generating a second random bit stream according to the first bit stream and a second clock signal. The second random bit stream with bell-shaped distribution is provided. In addition, by combining the pseudo-random bit stream generator and the MASH delta-sigma modulator, the random bit generator occupies smaller chip area and consumes less power consumption.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A random bit stream generator, comprising:
   a pseudo-random bit stream generator, generating a first random bit stream according to a first clock signal; and
   a multi-stage noise shaping (MASH) delta-sigma modulator, coupled to the first random bit stream generator, receiving the first random bit stream and outputting a second random bit stream according to the first random bit stream and a second clock signal,
   wherein a frequency of the second clock signal is greater than a frequency of the first clock signal, and the random bit stream has bell-shaped distribution.

2. The random bit stream generator of claim 1, wherein MASH delta-sigma modulator comprises:
   a first stage, generating a summed bit stream and an overflow bit stream according to the first random bit stream; and
   at least one subsequent stage, cascaded from the first stage, wherein each of the at least one subsequent stage generates a subsequent summed bit stream and a subsequent overflow bit stream according to a feedback bit stream of a previous stage,
   wherein the feedback bit stream of the previous stage is the summed bit stream of the previous stage being delayed for one clock cycle of the second clock signal.

3. The random bit stream generator of claim 2, wherein the first stage comprises:
   a first adder, summing up the first random bit stream and a feedback bit stream of the first stage to generate the summed bit stream and the overflow bit stream; and
   a first feedback circuit, coupled to the first adder, delaying the summed bit stream for one clock cycle of the second clock signal to generate the feedback bit stream of the first stage.

4. The random bit stream generator of claim 2, wherein each of the at least one subsequent stage comprises
   a subsequent adder, generating the subsequent summed bit stream and the subsequent overflow bit stream; and
   a subsequent feedback circuit, coupled to the subsequent adder, delaying the subsequent summed bit stream for one clock cycle of the second clock signal to generate the feedback bit stream of the subsequent stage.

5. The random bit stream generator of claim 2, wherein each of the subsequent stage further comprises:
   a holding circuit, coupled to the subsequent adder, configured to hold the overflow bit stream of the subsequent stage being delayed for a number of clock cycles of the second clock signal corresponding to the subsequent stage,
   wherein the second random bit stream is calculated according to the overflow of the first stage and the overflow bit stream stored in the holding circuit of each of the subsequent stage.

6. The random bit stream generator of claim 1, wherein
   the pseudo-random bit stream generator generates the first random bit stream of L-bits using linear feedback shift registers (LFSRs), L is an integer, and
   the MASH delta-sigma modulator is a first order MASH delta-sigma modulator which generates the second random bit stream of N-bits, N is integer different from L.

7. The random bit stream generator of claim 6, wherein the pseudo-random bit stream generator comprises:
   a plurality of D-flip-flops (DFFs) coupled in cascade, comprising a first DFF and a last DFF,
   a logical gate, performing a logical operation on outputs of two of the plurality of the DFFs to obtain a result, and outputting the result to the first DFF,
   wherein each of an intermediating DFF among the plurality of DFF receives an output from a previous DFF and providing an output to a next DFF, and the first random bit stream is outputted by the last DFF.

8. A method of generating a random bit stream adapted to a random bit stream generator, comprising:
   generating a first random bit stream according to a first clock signal; and
   generating a second random bit stream according to the first random bit stream and a second clock signal,
   wherein a frequency of the second clock signal is greater than a frequency of the first clock signal, and the second random bit stream has bell-shaped distribution.

9. The method of claim 8, wherein the random bit stream includes a pseudo-random bit stream generator and a multi-stage noise shaping (MASH) delta-sigma modulator, wherein
   the first random bit stream is generated by the pseudo-random bit stream generator using linear feedback shift registers (LFSRs), and
   the random bit stream is generated by the MASH delta-sigma modulator.

10. The method of claim 9, wherein the step of generating the random bit stream according to the first random bit stream and the second clock signal comprises:
    generating a summed bit stream and an overflow bit stream according to the first random bit stream in a first stage of the MASH delta-sigma modulator;

generates a subsequent summed bit stream and a subsequent overflow bit stream according to a feedback bit stream of a previous stage of the MASH delta-sigma modulator;

wherein the feedback bit stream of the previous stage is the summed bit stream of the previous stage being delayed for one clock cycle of the second clock signal.

11. The method of claim 8, wherein the first random bit stream is a L-bits random bit stream, L is an integer; and the second random bit stream is a N-bits random bit stream, N is integer different from L.

* * * * *